(12) United States Patent
Ito et al.

(10) Patent No.: US 7,804,880 B2
(45) Date of Patent: Sep. 28, 2010

(54) NITRIDE SEMICONDUCTOR LASER DEVICE AND NITRIDE SEMICONDUCTOR LASER APPARATUS

(75) Inventors: Shigetoshi Ito, Shijonawate (JP); Kunihiro Takatani, Nara (JP); Susumu Omi, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 97 days.

(21) Appl. No.: 11/922,986

(22) PCT Filed: Jun. 2, 2006

(86) PCT No.: PCT/JP2006/311116

§ 371 (c)(1),
(2), (4) Date: Dec. 28, 2007

(87) PCT Pub. No.: WO2007/004378

PCT Pub. Date: Jan. 11, 2007

(65) Prior Publication Data

US 2009/0095964 A1    Apr. 16, 2009

(30) Foreign Application Priority Data

Jun. 30, 2005    (JP)    ............................. 2005-192021

(51) Int. Cl.
H01S 3/097    (2006.01)
(52) U.S. Cl. .................... 372/87; 372/38.05; 257/745
(58) Field of Classification Search .................... 372/87, 372/38.05; 257/745
See application file for complete search history.

(56) References Cited

U.S. PATENT DOCUMENTS

| | | | |
|---|---|---|---|
| 5,392,305 A | 2/1995 | Jakobson | |
| 5,513,198 A | 4/1996 | Jakobson | |
| 5,629,952 A | 5/1997 | Bartholomew et al. | |
| 5,770,473 A | 6/1998 | Hall et al. | |
| 5,990,500 A * | 11/1999 | Okazaki | 257/99 |
| 6,268,618 B1 | 7/2001 | Miki et al. | |
| 6,326,223 B1 | 12/2001 | Miki et al. | |
| 6,403,987 B1 | 6/2002 | Miki et al. | |
| 7,655,953 B2 * | 2/2010 | Inoue et al. | 257/89 |
| 2003/0006422 A1 | 1/2003 | Miki et al. | |
| 2003/0099266 A1 * | 5/2003 | Watanabe et al. | 372/36 |
| 2004/0008744 A1 * | 1/2004 | Okazaki et al. | 372/36 |
| 2004/0165635 A1 * | 8/2004 | Sugimoto et al. | 372/46 |

(Continued)

FOREIGN PATENT DOCUMENTS

JP    02-067763    3/1990

(Continued)

*Primary Examiner*—Tod T Van Roy
(74) *Attorney, Agent, or Firm*—Harness, Dickey & Pierce, P.L.C.

(57) ABSTRACT

In one embodiment of the present invention, a long-life nitride semiconductor laser element is disclosed wherein voltage characteristics do not deteriorate even when the element is driven at high current density. Specifically disclosed is a nitride semiconductor laser element which includes a p-type nitride semiconductor and a p-side electrode formed on the p-type nitride semiconductor. In at least one embodiment, the p-side electrode has a first layer which is in direct contact with the p-type nitride semiconductor and a conductive second layer formed on the first layer, and the second layer contains a metal element selected from the group consisting of Ti, Zr, Hf, W, Mo and Nb, and an oxygen element.

18 Claims, 2 Drawing Sheets

U.S. PATENT DOCUMENTS

2004/0264533 A1 * 12/2004 Matsumura et al. ........... 372/45

FOREIGN PATENT DOCUMENTS

| | | |
|---|---|---|
| JP | 2-67763 | 3/1990 |
| JP | 7-147457 | 6/1995 |
| JP | 10-308534 | 11/1998 |
| JP | 10-335705 | 12/1998 |
| JP | 11-054843 | 2/1999 |
| JP | 11-177184 | 7/1999 |
| JP | 11-340569 | 12/1999 |
| JP | 2004-022918 | 1/2004 |

* cited by examiner

NITRIDE SEMICONDUCTOR LASER DEVICE AND NITRIDE SEMICONDUCTOR LASER APPARATUS

TECHNICAL FIELD

The present invention generally relates to a nitride semiconductor laser device using nitrogen as a III element and a V element and to a semiconductor laser apparatus using the nitride semiconductor laser device.

BACKGROUND ART

A nitride semiconductor laser device has characteristics such as excellence in luminous efficiency, fast operability, and light focusing characteristic, and therefore is expected as a short-wavelength light source for reading and writing of information with respect to high-density optical recording media. Also, the nitride semiconductor laser device itself is capable of emitting visible light and, further, of converting short-wavelength light emitted from the nitride semiconductor laser device to visible light with the use of wavelength conversion means, and therefore is expected to be used as a visible light source such as a light and a back light.

In order to meet these expectations, it is essential to develop a nitride semiconductor laser device that has a high luminous output and is driven stably for a long period of time. However, conventional nitride semiconductor laser devices have insufficient durability because of the problem of poor adhesivity between the electrodes and the semiconductor, which causes the electrode to easily peel off. Thus, the abilities of the nitride semiconductor laser devices are not utilized effectively.

As a technique to overcome the problem, for example, techniques in patent documents 1 and 2 are proposed.

Patent document 1: Japanese Patent Application Publication No. 11-54843.

Patent document 2: Japanese Patent Application Publication No. 11-340569.

Patent document 1 discloses a technique to provide, as a p-side electrode, an Ni layer, a Ti layer, and an Au layer on a p-type nitride semiconductor. The Ni layer is a layer for obtaining an ohmic contact by coming into contact with the p-type nitride semiconductor, the Au layer is a layer as a bonding metal, and the Ti layer is a layer for preventing the p-side electrode from peeling off by intervening between the foregoing layers to enhance adhesivity.

With this technique, the problem of the electrode peeling off can be solved.

Patent document 2 discloses a technique to form on a p-type nitride semiconductor an electrode of a two-layer structure having a first layer and a second layer. Specifically, as the first layer, Ni, Pd, or Pt, which excel in ohmic characteristic, is used at a portion that is in contact with the p-type nitride semiconductor. As the second layer, a metal with high adhesivity (e.g., Cr, Al, and Ti) against an insulation layer that is formed as a buried layer on the semiconductor surface of the semiconductor laser is used. With this technique, the problem of the p-electrode peeling off can be solved.

DISCLOSURE OF THE INVENTION

Problems that the Invention is to Solve

However, even when the above techniques are employed, if the device is driven at a high current density of 10 kA/cm$^2$ or more for the purpose of enhancing the luminous output, the device performance is degraded, resulting in an abnormal increase in voltage in a short period of time. Thus, there is such a problem that the luminous output still cannot be enhanced sufficiently.

The present invention has been made in order to solve the above problems, and an object of the present invention is to provide a highly reliable semiconductor laser device that can be used for a long period of time even at high current density.

The present inventors, as a result of an extensive study for the purpose of solving the above problems, have found that the rapid degradation of the device characteristics in the case of driving the semiconductor laser at a high current density of 10 kA/cm$^2$ or more is because the constituent molecules of the atmosphere gas ($N_2$, He, $H_2$, $Co_2$, CO and the like) existing around the device invade the semiconductor of the device, and that the degradation of the device characteristics caused by this can be prevented by, for example, providing at the p-side electrode a layer including an oxygen element and a metal element (Ti, Zr, Hf, W, Mo, or Nb). The present inventors then completed the present invention.

Means to Solve the Problems

A basic configuration of the present invention for solving the above problems is a nitride semiconductor laser device including: a p-type nitride semiconductor; and a p-side electrode formed on the p-type nitride semiconductor, wherein: the p-side electrode has a first layer having direct contact with the p-type nitride semiconductor and a second layer formed on the first layer and having conductivity; and the second layer includes a metal element selected from the group consisting of Ti, Zr, Hf, W, Mo, and Nb, and an oxygen element.

With this configuration, the metal element (Ti, Zr, Hf, W, Mo, or Nb) in the second layer prevents, in cooperation with the oxygen element, the atmosphere gas constituent molecules from invading the semiconductor. Thus, degradation of the device when used at high current density is inhibited.

While the metal element Ti, Zr, Hf, W, Mo, or Nb functions as a getter having high affinity with the constituent molecules of the atmosphere gas, the invasion of the atmosphere gas molecules cannot be sufficiently inhibited by the metal element alone. When a layer including an oxygen element together with the metal element Ti, Zr, Hf, W, Mo, or Nb is used, the invasion of the atmosphere gas molecules can be sufficiently inhibited, though the reason for this is not clearly understood.

The second layer also has the function to prevent the electrode from peeling off, thereby making it possible to improve the durability of the device.

On the other hand, the second layer, which includes a metal element and an oxygen element, is poor in ohmic electrode characteristic with respect to the p-type nitride semiconductor (i.e., has high contact resistance). Hence, the structure in which the second layer is in direct contact with the nitride semiconductor cannot sufficiently enhance the characteristics of the laser device. In view of this, in the above-described configuration of the present invention, a layer other than the second layer, that is, the first layer, intervenes between the second layer and the p-type nitride semiconductor. With this configuration, a layer superior to the second layer in ohmic electrode characteristic with respect to the p-type nitride semiconductor is rendered the first layer, thereby providing maximized advantageous effects of providing the second layer. Thus, the above-described configuration of the present invention realizes a high-output semiconductor laser device that can be used stably for a long period of time even at high current density In the above basic configuration, when a total number of metal elements and oxygen elements included in the second layer is assumed to be 1, an element number ratio of the oxygen elements to the total number may be less than 0.5.

If the element number ratio of the oxygen elements in the second layer is excessively large, the conductivity of the second layer decreases to fail to function as an electrode. Thus, the element number ratio of the oxygen elements is preferably specified in the above manner.

In the above basic configuration, the element number ratio of the oxygen elements to the total number is more preferably from 0.01 to 0.4. This range makes it possible to inhibit the invasion of the atmosphere gas molecules, and further, minimizes the decrease in conductivity.

In the above basic configuration, the first layer may have a structure composed of one layer or two or more layers. Still, in order to enhance the ohmic electrode characteristic with respect to the p-type nitride semiconductor, the first layer preferably includes an element selected from the group consisting of Pd, Ni, Co, and Pt at least at a side having direct contact with the p-type nitride semiconductor. When the first layer has a two-layer structure, the two-layer structure is preferably composed of: an inner layer A having direct contact with the p-type nitride semiconductor and composed of an element selected from the group consisting of Pd, Ni, Co, and Pt; and an inner layer B having direct contact with the second layer and composed of an element different from the element constituting the inner layer A and selected from the group consisting of Pd, Ni, Co, Pt, Au, Mo, Ti, and W.

Further in the above basic configuration, a bonding layer for connecting an electric wire for supplying an electric source to the laser device may be provided on the second layer. In this case, preferably, a barrier layer having direct contact with the second layer is provided between the bonding layer and the second layer; the barrier layer includes a metal element selected from the group consisting of Pd, Ni, Pt, Ti, Zr, Hf, W, Mo, and Nb, and an oxygen element; when a total number of metal elements and oxygen elements included in the barrier layer is assumed to be 1, an element number ratio of the oxygen elements is smaller than the element number ratio of the oxygen elements in the second layer; and the bonding layer is composed of an element selected from the group consisting of Au, Pt, Ni, Al, and Pd. Also, the barrier layer may include a metal element selected from the group consisting of Pd, Ni, Pt, Ti, Zr, Hf, W, Mo, and Nb; and the bonding layer may be composed of an element different from the element constituting the barrier layer and selected from the group consisting of Au, Pt, Ni, Al, and Pd.

With this configuration, the barrier layer prevents the elements in the bonding layer from diffusing and migrating into the second layer, thereby preventing degradation of device performance caused by diffusion of the constituent elements of the bonding layer.

A nitride semiconductor laser apparatus for solving the foregoing problems includes any of the above-described nitride semiconductor laser devices, and a package for sealing the nitride semiconductor laser device with oxygen gas existing on a periphery of the nitride semiconductor laser device.

As described above, the atmosphere gas has large influences on the device performance. The existence of oxygen gas on the periphery of the nitride semiconductor laser device significantly reduces degradation of the device performance, though the reason for this is not clearly understood. Thus, with this configuration, a highly reliable semiconductor laser apparatus that can be used for a long period of time is provided.

The oxygen gas existing on the periphery of the nitride semiconductor laser device is not necessarily a pure oxygen gas but may be a mixture gas. The content concentration (molar concentration percentage) of the oxygen gas in the mixture gas is preferably from 1 to 100%, more preferably from 10 to 40% or from 1 to 20%.

Effects of the Invention

As has been described above, according to the present invention, a long-life, high-output nitride semiconductor laser device and laser apparatus without electrode peeling off and an abnormal increase in voltage even when used at high current density of 10 kA/cm$^2$ or more are realized.

REFERENCE NUMERAL 10 p-type nitride semiconductor
11 p-side electrode
111 First layer
112 Second layer
113 Third layer
200 Substrate
201 GaN layer
202 Lower cladding layer
203 Guiding layer
204 Lower adjacent layer
205 Active layer
206 Upper adjacent layer
207 AlGaN layer
208 Upper cladding layer
209 Contact layer
220 n-side electrode
221 p-side electrode
222 Insulation film
231 First layer
232 Second layer
233 Third layer

BEST MODE FOR CARRYING OUT THE INVENTION

The embodiments of the present invention will be described with reference to the drawings. In the drawings, like reference numerals denote like or corresponding parts.

Embodiment 1

Figure 1:
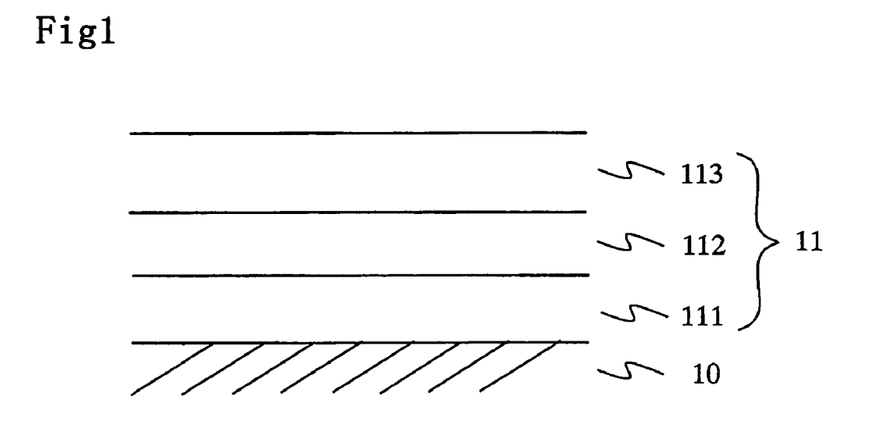
FIG. 1 is a diagram showing a p-side electrode structure of a nitride semiconductor laser device of the present invention.

FIG. 1 is a schematic cross sectional view of a nitride semiconductor laser device according to embodiment 1 for showing a p-side electrode structure. A p-side electrode 11 is formed on a contact layer 10 composed of a p-type nitride semiconductor doped with a II element (e.g., Mg) to be provided with p-type conductivity. The p-side electrode 11 is composed of a first layer 111, a second layer 112, and a third layer 113.

The first layer includes a metal exhibiting a preferable ohmic electrode characteristic with respect to the p-type nitride semiconductor. As this metal, Pd, Ni. Co, or Pt is preferably used, and Pd is more preferably used. The first layer may have a two-layer structure composed of an inner layer A having contact with a p-type semiconductor layer and an inner layer B above the inner layer A to have direct contact with the second layer. In this case, the inner layer A having contact with the p-type semiconductor layer uses Pd, Ni, Co, or Pt, which exhibits a preferable ohmic electrode characteristic. The layer above the inner layer A uses an element different from the element constituting the inner layer A such as Pd, Ni, Co, Pt, Au, Mo, Ti, and W, which excel in contactivity with respect to the inner layer A and the second layer.

The second layer 112 includes a metal element and an oxygen element and is made of a conductive material rich in metal elements. As the metal element, Ti, Zr, Hf, W, Mo, or Nb is preferably used. When the total number of metal elements and oxygen elements included in the second layer is assumed to be 1, the element number ratio of the oxygen elements to the total number is preferably less than 0.5 (i.e., the number of the oxygen elements is smaller than that of the metal elements), more preferably from 0.01 to 0.4, further more preferably from 0.01 to 0.25. If the oxygen element number ratio is 0.5 or more, a dielectric results such as TiO, creating a possibility of deteriorating conductivity. On the other had, if the oxygen element number ratio is excessively small, there is a possibility of undermining the advantageous effect of the present invention, which is to prevent an increase in voltage.

Above the second layer 112, the third layer 113 is formed. This layer, which is for making preferable a bonding characteristic between the laser device and an electrode outside the device, may not be formed. As a material for the layer to make the bonding characteristic preferable, Ni, Au, Al, Pd, Al, or the like is preferably used, and Au is more preferably used. The third layer 113 preferably has a two-layer structure composed of a bonding layer for bonding and a barrier layer intervening between the bonding layer and the second layer 112. The barrier layer is a layer for preventing the metal elements of the bonding layer from diffusing to the second layer during use of the device and from deteriorating the function of the second layer.

In the case of the two-layer structure, any of the materials exemplified above is used as the material for the bonding layer, and the barrier layer is preferably composed of an element that is different from the element constituting the bonding layer (i.e., the bonding layer and the barrier layer differ from one another in element composition) and that is at least one of Pd, Ni, Pt, Ti, Zr, Hf, W, Mo, and Nb. While the barrier layer may include an oxygen element, the oxygen element number ratio of the barrier layer is preferably smaller than that of the second layer. This configuration provides the effect of further enhancing adhesion with respect to the bonding layer. Further the barrier layer preferably uses a high melting point-element such as Ti, Pt, W, and Mo in that the effect of preventing the metal elements of the bonding layer from diffusing to the second layer during use of the device and from deteriorating the function of the second layer is effectively exhibited.

The nitride semiconductor used in the present invention preferably includes a nitride semiconductor crystal represented by the formula $Al_xGa_yIn_zN$ ($0 \leq x \leq 1$, $0 \leq y \leq 1$, $0 \leq z \leq 1$, $x+y+z=1$). When the nitride semiconductor crystal is of a hexagonal structure, less than 10% of the nitrogen elements may be substituted with at least one of the elements As, P, and Sb.

The nitride semiconductor layer may be doped with at least one of, for example, silicon (Si), oxygen (O), chlorine (Cl), sulfur (S), selenium (Se), carbon (C), germanium (Ge), zinc (Zn), cadmium (Cd), magnesium (Mg), and beryllium (Be) to be provided with p-type or n-type conductivity. In particular, as a p-type impurity, magnesium (Mg) is preferably used. It should be noted that for simplicity of description, the nitride semiconductor layer will occasionally be denoted as, for example, AlGaInN layer, without specifying the compound composition.

Embodiment 2

Figure 2:
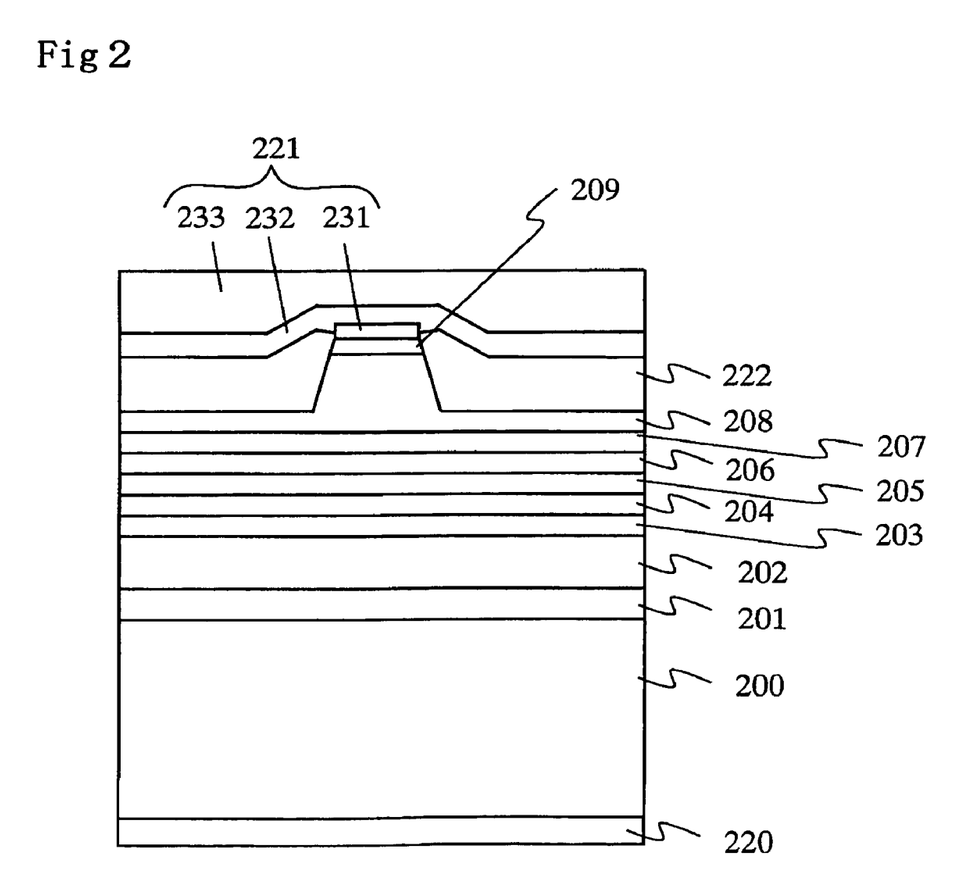
FIG. 2 is a schematic cross sectional view of a nitride semiconductor laser device according to example 1.

FIG. 2 is a schematic cross sectional view of a nitride semiconductor laser device according to embodiment 2. This nitride semiconductor laser has such a configuration that on an n-type GaN substrate 200, an n-GaN layer 201, an n-$Al_{0.05}Ga_{0.95}N$ lower cladding layer 202, an n-GaN guiding layer 203, a GaN lower adjacent layer 204, an active layer 205, a GaN upper adjacent layer 206, a p-$Al_{0.2}Ga_{0.8}N$ layer 207, a p-$Al_{0.1}Ga_{0.9}N$ upper cladding layer 208, and a p-GaN contact layer 209 are formed in this order. On the back surface of the substrate, a p-side electrode 221 is formed having contact with the n-side electrode 220 and the p-GaN contact layer 209. The p-side electrode has first to third layers, similarly to embodiment 1 above. The upper cladding layer 208 and the contact layer 209 are extended in a stripe form in the resonator direction to constitute a ridge-stripe type waveguide. Portions other than the ridge-stripe portion are buried in an insulation film 222 to realize current constriction. The device is subjected to AR coating on the front surface and HR coating on the back surface.

The p-type layer contains, for example, magnesium (Mg) as a p-dope impurity at a density of $1 \times 10^{19}$ to $1 \times 10^{20}/cm^3$. A representative density in the upper cladding layer 208 and the contact layer 209 is $4 \times 10^{19}/cm^3$. The p-GaN layer may be omitted so that the upper cladding layer may also serve as the contact layer.

The active layer 205 is of a multi-quantum well structure composed of undoped well layers and undoped barrier layers, which are formed in the order: well layer, barrier layer, well layer, barrier layer, well layer (3 wells).

The well layer and the barrier layer may be formed of $In_xGa_{1-x}N$ ($0 \leq x < 1$), $Al_xGa_{1-x}N$ ($0 \leq x < 1$), InGaAlN, $GaN_{1-x}As_x$ ($0 < x < 1$), $GaN_{1-x}P_x$ ($0 < x < 1$), or a nitride semiconductor of any of these compounds. A preferable composition is such that the barrier layer has large band gap energy than that of the well layer. While the active layer preferably has a multi-quantum well structure (MQW structure) of two to four well layers in order to set the oscillation threshold value of the device low, a single quantum well structure (SQW structure) may be employed. In this case, there is no barrier layers sandwiched between the well layers.

The p-side electrode 221 is composed of, from the side having contact with the p-GaN contact layer 209, a first layer 231 (Pd layer and Mo layer), a second layer 232 (TiOx layer), and a third layer 233 (Pt layer and Au layer). Here the second layer and the third layer are also formed on the insulation film 222. The TiOx layer has a good adhesion characteristic with respect to the insulation film and therefore has a function similar to the function of Ti used in conventional laser devices to improve adhesion.

The first layer is composed of a Pd layer (inner layer A) having contact with the p-type nitride semiconductor and an MO layer (inner layer B) formed above the Pd layer. The Pd layer is a layer for having ohmic contact with the p-type nitride semiconductor.

The second layer (TiOx layer) is formed above the first layer so as to cover at least part of the ohmic contact portion with the p-type nitride semiconductor. The composition ratio of oxygen in the TiOx is preferably Ti>O, and more preferably, when the total number of O (oxygen) and Ti (titanium) is assumed to be 1, the composition ratio of the oxygen to the total number is from 0.01 to 0.4. By employing such composition, preferable conductivity required of an electrode is obtained.

The third layer is composed of a Pt layer (barrier layer) formed above the second layer and an Au layer (bonding layer) formed above the Pt layer. The Au layer is the uppermost layer of the p-side electrode and a layer for carrying out bonding. The Pt layer is a barrier layer against metal for bonding.

The thickness of each of the layers is as follows. The first layer (Pd layer) is from 5 to 300 nm thick, the first layer (Mo layer) is from 5 to 300 nm thick, the second layer (TiOx layer) is from 5 to 300 nm thick, the third layer (Pt layer) is from 5 to 300 nm thick, and the third layer (Au layer) is 100 nm to 10 μm thick.

The insulation film 222 is formed on the nitride semiconductor (upper cladding layer 208) and has contact with the p-side electrode 221. While the material of the insulation film 222 is not specified, in view of improving the adhesion characteristic with respect to the nitride semiconductor, the insulation film 222 is preferably formed of any of silicon oxide, aluminum oxide, zirconium oxide, tantalum oxide, magnesium oxide, calcium fluoride, and magnesium fluoride. Also the insulation film may be composed of two or more layers, instead of a one-layer structure. In the case of employing the structure of two or more layers, it is preferable to select a material with small absorption of luminance as the layer having contact with the nitride semiconductor, and as the layer above said layer and having contact with the p-side electrode, a material excellent in adhesion characteristic with respect to the electrode.

The semiconductor laser device with the above-described configuration may be fabricated by a known crystal growth method for nitride semiconductors. Each of the semiconductor layers may be accumulated by, for example, a metal-organic chemical vapor deposition method (MOCVD method), and the ridge-stripe structure may be formed by etching processing with the use of dry etching. For each of the layers constituting the p-side electrode, film forming methods such as an electron beam (EB) vacuum deposition method and a high-frequency sputtering method may be used. The TiOx layer may be formed by using Ti as a raw material and containing oxygen in the film forming atmosphere, or by using oxidized Ti as a raw material.

EXAMPLE 1

The present invention will be described further in detail with reference to examples. A semiconductor laser device according to example 1 employs the same structure as that of embodiment 2 as shown in FIG. 2, and specific sizes of the parts are as follows.

n-GaN layer 201: 0.5 μm thick.
n-$Al_{0.05}Ga_{0.95}N$ lower cladding layer 202: 2 μm thick.
n-GaN guiding layer 203: 0.1 μm thick.
GaN lower adjacent layer 204: 20 nm thick.
Active layer 205: 28 nm thick.
GaN upper adjacent layer 206: 50 nm thick.
p-$Al_{0.2}Ga_{0.8}N$ layer 207: 20 nm thick.
p-$Al_{0.1}Ga_{0.9}N$ upper cladding layer 208: 0.6 μm thick.
p-GaN contact layer 209: 0.1 μm thick.
First layer 231 (Pd layer): 50 nm.
First layer 231 (Mo layer): 100 nm.
Second layer 232 (TiOx layer): 20 nm.
Third layer 233 (Pt layer): 100 nm.
Third layer 233 (Au layer): 500 nm.

The width of the ridge-stripe was set to approximately 1.6 μm and the resonator length was set to 600 μm.

The active layer 205 is of a multi-quantum well structure composed of undoped $In_{0.15}Ga_{0.85}N$ well layers (thickness: 4 nm) and undoped GaN barrier layers (thickness: 8 nm), which are formed in the order: well layer, barrier layer, well layer, barrier layer, well layer (3 wells).

The nitride semiconductor layers were sequentially accumulated on the substrate by the metal-organic chemical vapor deposition method (MOCVD method). The ridge-stripe structure was formed by etching processing with the use of dry etching. For the layers constituting the p-side electrode, the electron beam (EB) vacuum deposition method was used. The TiOx layer was formed by using Ti as a raw material and containing oxygen in the film forming atmosphere.

The nitride semiconductor laser device according to example 1 fabricated in the above-described manner was mounted inside a laser package and sealed, followed by an electrification test. The atmosphere of the sealing was a mixture gas of 10% oxygen gas and 90% nitrogen gas. A test condition was constant current driving (approximately 13 $kA/cm^2$) at DC 120 mA under a high temperature of 60° C., in order to monitor the device voltage. The results are shown in FIG. 3.

Figure 3:
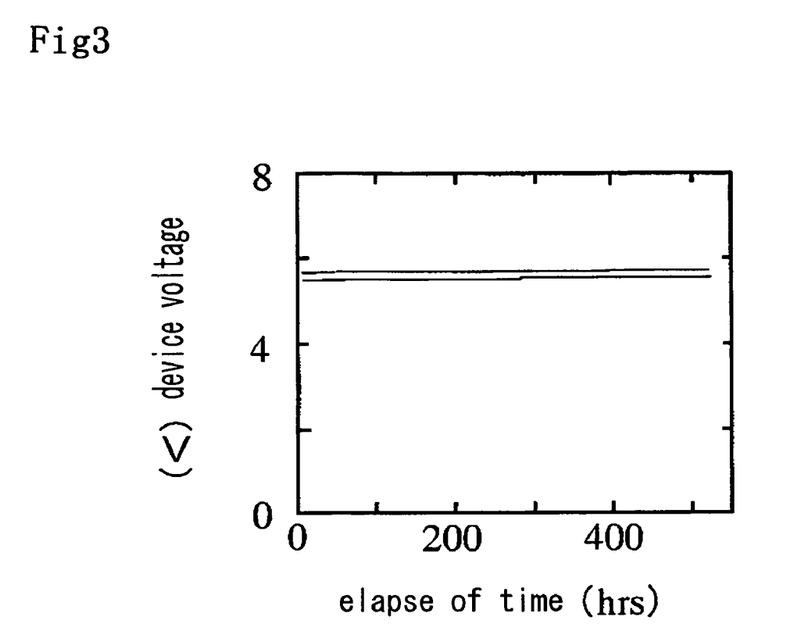
FIG. 3 is a graph showing the results of an electrification test of the nitride semiconductor laser device according to example 1.

As clearly seen from FIG. 3, the laser device according to example 1 is driven stably at a constant device voltage (approximately 5.7 V) after elapse of 500 hours or more. As seen from the fact that the device voltage is approximately 5.7 V, electrification is realized through the second layer, which means that the second layer has conductivity. Thus, the laser device according to the present example exhibited a stable voltage characteristic even when the driving condition was a high current density of approximately 13 $kA/cm^2$.

COMPARATIVE EXAMPLE 1

A laser device was fabricated in a similar manner to the one used in example 1 except that the second layer was not provided and a Ti layer was formed between the insulation film and the third layer. (The Ti layer was not formed above the first layer.) The Ti layer is for enhancing adhesivity with respect to the third layer. After similar packaging, a similar electrification test was carried out. The results are shown in FIG. 4.

Figure 4:
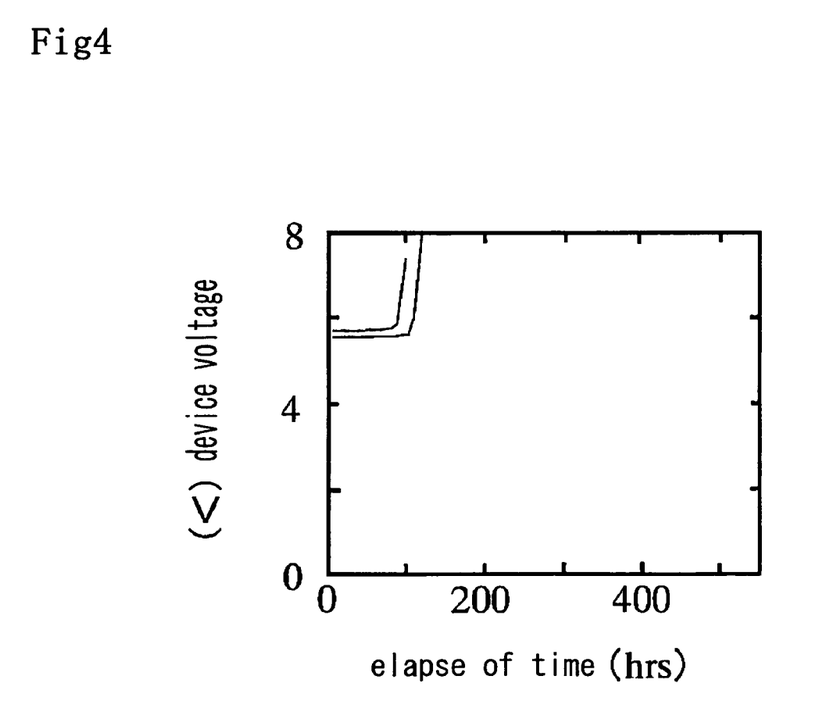
FIG. 4 is a graph showing the results of an electrification test of the nitride semiconductor laser device according to comparative example 1.

As clearly seen from FIG. 4, the voltage raised to 8 V or beyond around 100 hours of driving.

COMPARATIVE EXAMPLE 2

A laser device was fabricated in a similar manner to the one used in example 1 except that Ti was used as the second layer (oxygen not included). After similar packaging, a similar electrification test was carried out. Similarly to comparative example 1, the voltage raised to 8 V or beyond at approximately 150 hours of driving.

COMPARATIVE EXAMPLE 3

After similar packaging to the one in comparative example 1 except that the sealing atmosphere was 100% nitrogen gas (oxygen not included), a similar electrification test was carried out. Similarly to comparative example 1, the voltage raised to 8 V or beyond at approximately 30 hours of driving.

COMPARATIVE EXAMPLE 4

A laser device was fabricated in a similar manner to the one used in example 1 except that the lower cladding layer 202 and the upper cladding layer 208 were not formed. After similar packaging, a similar electrification test was carried out. Although there was no increase in voltage, the laser device could not be used as laser because there were no cladding layers.

The results will be analyzed below. As clearly seen from a comparison between comparative example 1 and comparative example 3, introduction of $O_2$ in the atmosphere gas sealed in the package tends to inhibit degradation. Although no tests were carried out for the inventive examples under an oxygen-free state, a similar phenomenon is predicted in the inventive examples. Therefore, the laser devices of the inventive examples are preferably sealed in an atmosphere containing oxygen rather than in an atmosphere without it.

As clearly seen from a comparison between comparative example 1 and comparative example 4, use of AlGaN for the p-type semiconductor easily causes degradation, while use of GaN tends to inhibit degradation. The dependence of the degree of degradation upon the sealing atmosphere and the composition of the p-type semiconductor is possibly because the atoms or molecules of the atmosphere gas go in and out of the semiconductor through the p-type electrode during electrification, thereby affecting the device (voltage) characteristics. Since the above degradation is not seen unless injection of current is carried out at a high current density of over 10 $kA/cm^2$, the degradation phenomenon is believed to be a phenomenon involved in current injection. Thus, TiOx, which was introduced in the present invention to serve as the second layer, is believed to effectively inhibit traffic of atoms or molecules through the electrified electrode.

Here Ti is known as a getter to take in the atmosphere gas (i.e., the molecules of $H_2$, $N_2$, He, $CO_2$, CO, and the like). Use of Ti alone as in comparative example 2 is not sufficient for preventing degradation during electrification. As in example 1, the oxygen element is preferably held in the second layer along with the metal element (Ti). This is believed to be as significant as introduction of $O_2$ in the sealing atmosphere, which causes the tendency toward inhibiting degradation. Also the oxygen element is not an element associated with the increase in voltage, but, conversely, the oxygen element coexisting with the high melting-point metal such as Ti restricts traffic of the atoms that cause voltage to increase by going in and out of the device.

EXAMPLE 2

A laser device and a laser apparatus (package) were fabricated in a similar manner to the one used in example 1 except that MoOx (the element number ratio of oxygen elements being 0.2) was used as the second layer. An electrification test similar to the one in example 1 was carried out to the laser device. The laser device was driven stably at a constant device voltage (approximately 5.7 V) after elapse of 500 hours or more.

While in the above inventive examples Ti or Mo is used as the metal element to constitute the second layer, a high melting-point metal element such as Ti, Zr, Hf, W, Mo, or Nb that functions as a getter of gas, has conductivity, and is capable of forming into a metal element-rich alloy with oxygen element may be used.

While in the above inventive examples the second layer is exemplified as a layer to cover the insulation film formed on the semiconductor, the second layer may be a layer formed only inside the ridge-stripe structure.

The above embodiments and examples are provided for exemplary purposes only and should not be construed as limiting the configuration of the present invention. Various modifications are of course possible.

INDUSTRIAL APPLICABILITY

The present invention finds applications in nitride semiconductor lasers, and in particular, in high-output devices required to be driven at a high current density of over 10 $kA/cm^2$. Examples of these devices include devices that provide a light output of 100 mW or more in the single transverse mode type. The present invention also finds applications in semiconductor laser apparatus using nitride semiconductor such as single semiconductor laser apparatuses, hologram laser apparatuses using hologram devices, optoelectronics IC apparatuses packaged integrally with IC chips for processing for driving or signal detection and the like, composite optical apparatuses packaged integrally with waveguides or minute optical devices, optical recording systems equipped with the foregoing apparatuses, optical disc systems equipped with the foregoing apparatuses, and light source systems in ultraviolet to green spectrums equipped with the foregoing apparatuses. Thus, the industrial applicability of the present invention is considerable.

What is claimed is:

1. A nitride semiconductor laser device comprising:
   a p-type nitride semiconductor; and
   a p-side electrode formed on the p-type nitride semiconductor, wherein:
   the p-side electrode has a first layer having direct contact with the p-type nitride semiconductor, a second layer formed on the first layer and having conductivity, and a bonding layer formed on the second layer; and
   the second layer includes a metal element selected from the group consisting of Ti, Zr, Hf, W, Mo, and Nb, and an oxygen element, wherein when a total number of metal elements and oxygen elements included in the second layer is assumed to be 1, an element number ratio of the oxygen elements to the total number is from 0.01 to 0.4.

2. The nitride semiconductor laser device according to claim 1, wherein the first layer includes an element selected from the group consisting of Pd, Ni, Co, and Pt.

3. The nitride semiconductor laser device according to claim 2, further comprising a barrier layer provided between the bonding layer and the second layer and having direct contact with the second layer, wherein:
   the barrier layer includes a metal element selected from the group consisting of Pd, Ni, Pt, Ti, Zr, Hf, W, Mo, and Nb, and an oxygen element;
   when a total number of metal elements and oxygen elements included in the barrier layer is assumed to be 1, an element number ratio of the oxygen elements is smaller than the element number ratio of the oxygen elements in the second layer; and
   the bonding layer is composed of an element selected from the group consisting of Au, Pt, Ni, Al, and Pd.

4. The nitride semiconductor laser device according to claim 2, further comprising a barrier layer provided between the bonding layer and the second layer and having direct contact with the second layer, wherein:

the barrier layer includes a metal element selected from the group consisting of Pd, Ni, Pt, Ti, Zr, Hf, W, Mo, and Nb; and the bonding layer is composed of an element different from the element constituting the barrier layer and selected from the group consisting of Au, Pt, Ni, Al, and Pd.

5. The nitride semiconductor laser device according to claim 1, wherein the first layer comprises:

an inner layer A having direct contact with the p-type nitride semiconductor and composed of an element selected from the group consisting of Pd, Ni, Co, and Pt; and an inner layer B having direct contact with the second layer and composed of an element different from the element constituting the inner layer A and selected from the group consisting of Pd, Ni, Co, Pt, Au, Mo,. Ti, and W.

6. The nitride semiconductor laser device according to claim 5, further comprising a barrier layer provided between the bonding layer and the second layer and having direct contact with the second layer, wherein:

the barrier layer includes a metal element selected from the group consisting of Pd, Ni, Pt, Ti, Zr, Hf, W, Mo, and Nb, and an oxygen element;

when a total number of metal elements and oxygen elements included in the barrier layer is assumed to be 1, an element number ratio of the oxygen elements is smaller than the element number ratio of the oxygen elements in the second layer; and the bonding layer is composed of an element selected from the group consisting of Au, Pt, Ni, Al, and Pd.

7. The nitride semiconductor laser device according to claim 5, further comprising a barrier layer provided between the bonding layer and the second layer and having direct contact with the second layer, wherein:

the barrier layer includes a metal element selected from the group consisting of Pd, Ni, Pt, Ti, Zr, Hf, W, Mo, and Nb; and the bonding layer is composed of an element different from the element constituting the barrier layer and selected from the group consisting of Au, Pt, Ni, Al, and Pd.

8. A nitride semiconductor laser apparatus comprising:
a nitride semiconductor laser device according to claim 1; and
a package for sealing the nitride semiconductor laser device with oxygen gas existing on a periphery of the nitride semiconductor laser device.

9. The nitride semiconductor laser apparatus according to claim 8, wherein a molar concentration percentage of the oxygen gas in the package is from 1 to 20%.

10. A nitride semiconductor laser device comprising:
a p-type nitride semiconductor; and
a p-side electrode formed on the p-type nitride semiconductor, wherein:

the p-side electrode has a first layer having direct contact with the p-type nitride semiconductor, a second layer formed on the first layer and having conductivity, and a bonding layer formed on the second layer; and the second layer includes a metal element selected from the group consisting of Ti, Zr, Hf, W, Mo, and Nb, and an oxygen element, wherein the first layer comprises an inner layer A having direct contact with the p-type nitride semiconductor and composed of an element selected from the group consisting of Pd, Ni, Co, and Pt; and an inner layer B having direct contact with the second layer and composed of an element different from the element constituting the inner layer A and selected from the group consisting of Pd, Ni, Co, Pt, Au, Mo, Ti, and W.

11. A nitride semiconductor laser device comprising:
a p-type nitride semiconductor;
a p-side electrode formed on the p-type nitride semiconductor, wherein:

the p-side electrode has a first layer having direct contact with the p-type nitride semiconductor, a second layer formed on the first layer and having conductivity, and a bonding layer formed on the second layer; and the second layer includes a metal element selected from the group consisting of Ti, Zr, Hf, W, Mo, and Nb, and an oxygen element, and barrier layer provided between the bonding layer and the second layer and having direct contact with the second layer, wherein:

the barrier layer includes a metal element selected from the group consisting of Pd, Ni, Pt, Ti, Zr, Hf, W, Mo, and Nb, and an oxygen element;

when a total number of metal elements and oxygen elements included in the barrier layer is assumed to be 1, an element number ratio of the oxygen elements is smaller than element number ratio of the oxygen elements in the second layer; and the bonding layer is composed of an element selected from the group consisting of Au, Pt, Ni, Al, and Pd.

12. A nitride semiconductor laser device comprising:
a p-type nitride semiconductor;
a p-side electrode formed on the p-type nitride semiconductor, wherein:

the p-side electrode has a first layer having direct contact with the p-type nitride semiconductor, a second layer formed on the first layer and having conductivity, and a bonding layer formed on the second layer; and the second layer includes a metal element selected from the group consisting of Ti, Zr, Hf, W, Mo, and Nb, and an oxygen element, wherein when a total number of metal elements and oxygen elements included in the second layer is assumed to be 1, an element number ratio of the oxygen elements to the total number is less than 0.5, and a barrier layer provided between the bonding layer and the second layer and and having direct contact with the second, wherein:

the barrier layer includes a metal element selected from the group consisting of Pd, Ni, Pt, Ti, Zr, Hf, W, Mo, and Nb; and the bonding layer is composed of an element different form the element constituting the barrier layer and selected from the group consisting of Au, Pt, Ni, Al, and Pd.

13. A nitride semiconductor laser device comprising:
a p-type nitride semiconductor; and
a p-side electrode formed on the p-type nitride semiconductor, wherein:

the p-side electrode has a first layer having direct contact with the p-type nitride semiconductor, a second layer formed on the first layer and having conductivity, and a bonding layer formed on the second layer;

the first layer includes Pd and an inner layer A having direct contact with the p-type nitride semiconductor and composed of an element selected from the group consisting of Pd, Ni, Co, and Pt; and an inner layer B having direct contact with the second layer and composed of an element different from the element consisting of the inner layer A and selected from the group consisting of Pd, Ni, Co, Pt, Au, Mo, Ti, and W; and the second layer includes a metal element selected from the group consisting of Ti, Zr, Hf, W, Mo, and Nb, and an oxygen element.

14. The nitride semiconductor laser device according to claim 13, wherein when a total number of metal elements and oxygen elements included in the second layer is assumed to be 1, an element number ratio of the oxygen elements to the total number is less than 0.5.

15. A nitride semiconductor laser apparatus comprising:
a nitride semiconductor laser device according to claim 13; and
a package for sealing the nitride semiconductor laser device with oxygen gas existing on a periphery of the nitride semiconductor laser device.

16. The nitride semiconductor laser apparatus according to claim 15, wherein a molar concentration percentage of the oxygen gas in the package is from 1 to 20%.

17. A nitride semiconductor laser device comprising:
a p-type nitride semiconductor; and
a p-side electrode formed on the p-type nitride semiconductor, wherein:
the p-side electrode has a first layer having direct contact with the p-type nitride semiconductor, a second layer formed on the first layer and having conductivity, and a bonding layer formed on the second layer;
the first layer includes Pd;
the second layer includes a metal element selected from the group consisting of Ti, Zr, Hf, W, Mo, and Nb, and an oxygen element;
a barrier layer provided between the bonding layer and the second layer and having direct contact with the second layer, wherein:
the barrier layer includes a metal element selected from the group consisting of Pd, Ni, Pt, Ti, Zr, Hf, W, Mo, and Nb, and an oxygen element;
when a total number of metal elements and oxygen elements included in the barrier layer is assumed to be 1, an element number ratio of the oxygen elements is smaller than the element number ratio of the oxygen elements in the second layer; and
the bonding layer is composed of an element selected from the group consisting of Au, Pt, Ni, Al, and Pd.

18. A nitride semiconductor laser device comprising:
a p-type nitride semiconductor; and
a p-side electrode formed on the p-type nitride semiconductor, wherein:
the p-side electrode has a first layer having direct contact with the p-type nitride semiconductor, a second layer formed on the first layer and having conductivity, and a bonding layer formed on the second layer;
the first layer includes Pd; and
the second layer includes a metal element selected from the group consisting of Ti, Zr, Hf, W, Mo, and Nb, and an oxygen element,
wherein when a total number of metal elements and oxygen elements included in the second layer is assumed to be 1, an element number ratio of the oxygen elements to the total number is less than 0.5
a barrier layer provided between the bonding layer and the second layer and having direct contact with the second layer, wherein:
the barrier layer includes a metal element selected from the group consisting of Pd, Ni, Pt, Ti, Zr, Hf, W, Mo, and Nb; and
the bonding layer is composed of an element different from the element constituting the barrier layer and selected from the group consisting of Au, Pt, Ni, Al, and Pd.

* * * * *